United States Patent [19]
Kim

[11] Patent Number: 6,127,705
[45] Date of Patent: *Oct. 3, 2000

[54] STATIC RANDOM ACCESS MEMORY CELL SUITABLE FOR HIGH INTEGRATION DENSITY AND CELL STABILIZATION

[75] Inventor: Dong Sun Kim, Seoul, Rep. of Korea

[73] Assignee: LG Semicon Co., Ltd., Chungcheongbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/499,990

[22] Filed: Jul. 10, 1995

[30] Foreign Application Priority Data

Jul. 11, 1994 [KR] Rep. of Korea ...................... 94-16637

[51] Int. Cl.[7] ............................. H01L 29/76; H01L 27/11
[52] U.S. Cl. ........................... 257/368; 257/903; 257/904
[58] Field of Search ................................... 257/368, 904, 257/903; 438/459, 238

[56] References Cited

U.S. PATENT DOCUMENTS 5,426,065   6/1995  Chan et al. ............................. 438/238
5,804,495   9/1998  Saito et al. ............................. 438/459

OTHER PUBLICATIONS

Ikeda et al., "A Stacked Split Word–Line (SSW) cell for low voltage operation, large capacity, high speed SRAMs", IEEE, 1993, pp. 809–812.

*Primary Examiner*—Steven H. Loke
*Attorney, Agent, or Firm*—Finnegan, Henderson, Farabow, Garrett & Dunner, L.L.P.

[57] ABSTRACT

Static random access memory (SRAM) cell is disclosed, which is suitable for high packing density and cell stabilization, including a substrate, a wordline formed over the substrate, including two parallel legs having gates of first and second access transistors, respectively, gates of first and second drive transistors formed between the two parallel legs, and an active area defined in a surface of the substrate under the gates of the first and second access transistors and gates of the first and second drive transistors.

24 Claims, 14 Drawing Sheets

F I G.8A
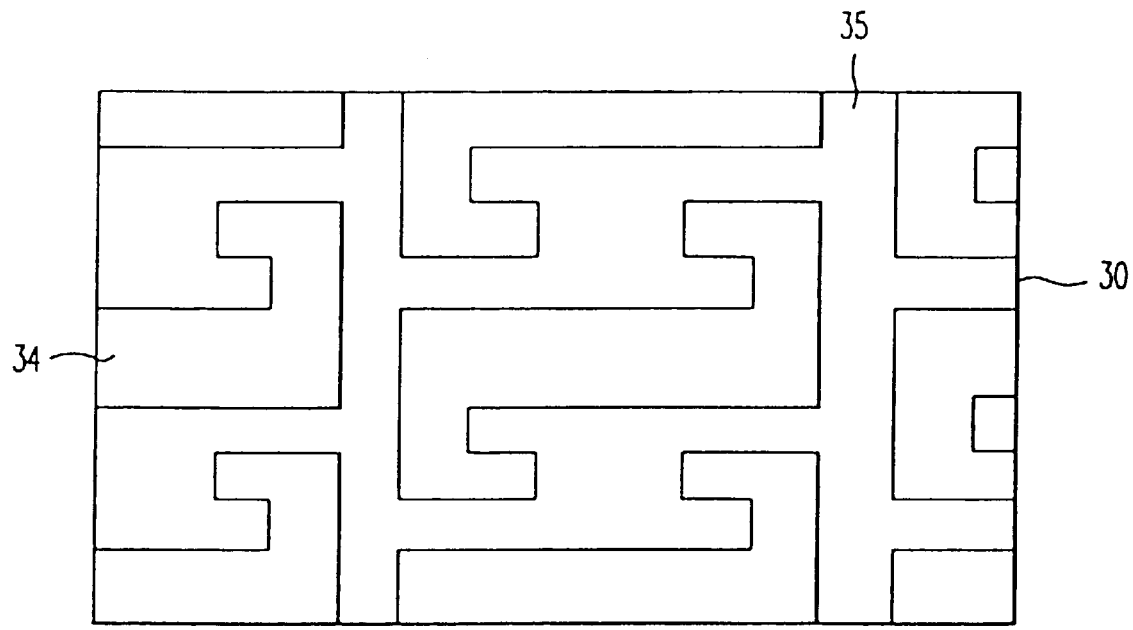
F I G.8B
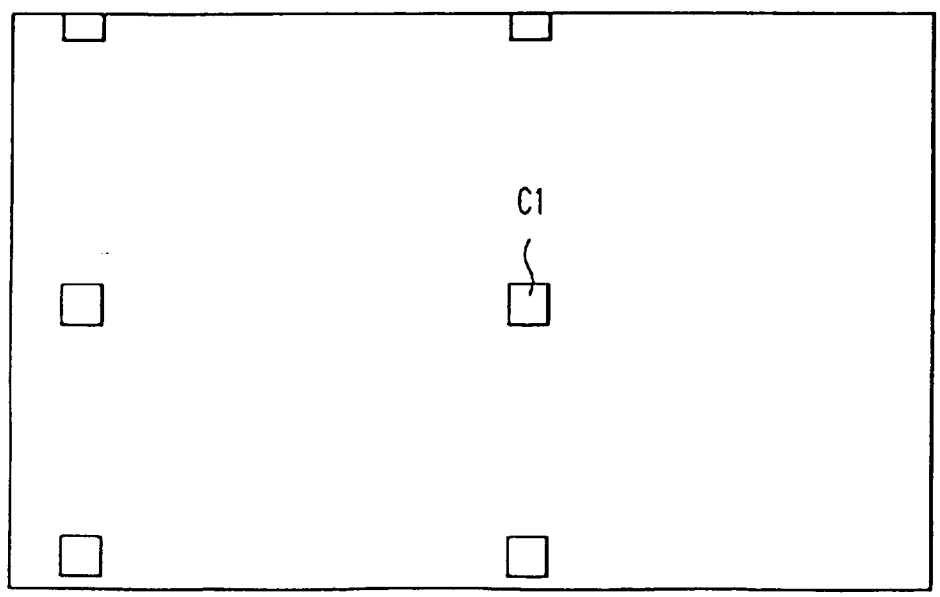

STATIC RANDOM ACCESS MEMORY CELL SUITABLE FOR HIGH INTEGRATION DENSITY AND CELL STABILIZATION

BACKGROUND OF THE INVENTION

The present invention relates to a semiconductor device, and more particularly, to a static random access memory (SRAM) cell and method of manufacturing the same, which are suitable for high packing density and cell stabilization.

FIG. 1A is a plan view of a conventional SRAM. FIG. 1B is an equivalent circuit diagram of FIG. 1A.

Referring to FIGS. 1A and 1B, in the conventional SRAM cell, a wordline W/L acting a, the gate of first and second access transistors TA1 and TA2, and bitlines B/L1 and B/L2 connected to each other through drain area D of access transistors TA1 and TA2 and a contact I4.

Gate G of first and second drive transistors TD1 and TD2 is connected to active area B, that is, source area S, of access transistors TA1 and TA2 via contacts I1 and I2, and simultaneously to a load resistor R through which a power voltage Vcc is supplied. Drain area D of first and second drive transistors TD1 and TD2 is coupled to source area S of first and second access transistors TA1 and TA2 via N+ junction. Source area S of first and second drive transistors TD1 and TD2 is coupled to a conductive line G via contact I3.

In the method of manufacturing the conventional SRAM cell, the gate of transistor made of a first polysilicon layer is formed on a substrate which is divided into a field area A and active area B. Gate G of first and second drive transistors TD1 and TD2 is floated to be in contact with active area B through first contact I1. Gate G of access transistors TA1 and TA2 becomes wordline W/L.

After a first CVD oxide layer is formed on the overall surface of the substrate, a second contact I2 is formed. Then, a second polysilicon layer is deposited and patterned in a form to thereby form conductive line G. A second CVD oxide layer is deposited on the overall surface of the substrate and selectively etched to thereby form a third contact I3. Thereafter, a third polysilicon layer is deposited and patterned to form load resistor R. This load resistor is connected to floating gate G of drive transistors TD1 and TD2 through third contact I3.

A third CVD oxide layer is deposited on the overall surface of the substrate and selectively etched to form a fourth contact I4 on the drain area of access transistors TA1 and TA2. A bitline of metal is formed to be connected to the drain area of access transistors TA1 and TA2 through fourth contact I4. By doing so, a conventional SRAM cell is fabricated.

In the above structure of SRAM cell, the cell is unstable due to asymmetricity and there is a limit in controlling the load resistor. This involves difficulty in controlling cell standby current and in high integration because the cell is large.

SUMMARY OF THE INVENTION

Therefore, it is an object of the present invention to provide an SRAM cell suitable for high integration and cell stabilization, and a method of fabricating the same.

To accomplish the object of the present invention, there is provided a semiconductor device comprising: a substrate divided into active and field areas; a first contact formed in the active area of the substrate; a substrate contact portion formed in the first contact; a first conductive line made up of a body spaced from the substrate contact portion and a pair of legs elongated in parallel from both edges of the body between the substrate contact portion; first and second electrodes formed above the pair of legs of the first conductive line and above the active area between the legs, while being spaced from the substrate contact portion; a pair of first high-concentration impurity areas formed in the active area of the first leg of the pair of legs; a pair of second high-concentration impurity areas formed in the active area of the second leg of the pair of legs; a pair of third high-concentration impurity areas formed in the active area between the respective electrodes and substrate contact portion; a second contact formed in one of the pair of first high-concentration impurity areas; a third contact formed in one of the pair of second high-concentration impurity areas; a fourth contact formed on the first electrode above the first leg; a fifth contact formed on the second electrode above the second leg; a second conductive line elongated from the second contact to be intersected with the first leg of the first conductive line, the second conductive line being elongated from the second contact to the fifth contact above the second leg to thereby come into contact with the second electrode; a third conductive line elongated to be intersected with the second leg of the first conductive line through the third contact, the third conductive line being elongated from the third contact to the fourth contact above the first leg to thereby come into contact with the first electrode; a sixth contact formed on the other portion of the pair of first highconcentration impurity area; a seventh contact formed on the other portion of the pair of second high-concentration impurity area; a fourth conductive line coming into contact with the other first high-concentration impurity area through the sixth contact, the fourth conductive line being formed long above the first electrode to be intersected with the first and second legs; and a fifth conductive line coming into contact with the other second high-concentration impurity area through the seventh contact, the fifth conductive line being formed long above the second electrode to be intersected with the first and second legs.

To accomplish the object of the present invention, there is further provided a method of fabricating a semiconductor device comprising the steps of: forming a first contact in an active area of a substrate; depositing a first conductive material on the overall surface of the substrate including the first contact; patterning the first conductive material to form a substrate contact portion in the contact, and forming a first conductive line made up of a body spaced from the substrate contact portion and a pair of legs elongated in parallel from both edges of the body between the substrate contact portion; depositing a second conductive material on the substrate including the first conductive line; patterning the second conductive material to form first and second electrodes above the pair of legs of the first conductive line and above the active area between the legs, while being spaced from the substrate contact portion; implanting an impurity into the active area, while taking the first conductive line and first and second electrodes as masks, and forming a pair of first high-concentration impurity areas in the active area of the first leg of the first conductive line adjacent to the first electrode, a pair of second high-concentration impurity areas in the active area of the second leg adjacent to the second electrode, and a pair of third high-concentration impurity areas in the active area between the respective electrodes and substrate contact portion; forming a first insulating layer on the overall surface of the substrate; selectively etching the first insulating layer to form a second contact and third contact in one of the pair of first high-concentration impurity areas and in one of the pair of second high-concentration impurity areas, respectively, and a fourth contact and fifth contact on the first electrode and on the second electrode, respectively; forming a third conductive material on the overall surface of the substrate; patterning the third conductive layer to form a second conductive line elongated from the second contact to be intersected with the first leg of the first conductive line, the second conductive line being elongated from the second contact to the fifth contact above the second leg to thereby come into contact with the second electrode, and to form a third conductive line elongated to be intersected with the second leg of the first conductive line through the third contact, the third conductive line being elongated from the third contact to the fourth contact above the first leg to thereby come into contact with the first electrode; forming a second insulating layer on the overall surface of the substrate; selectively etching the second and first insulating layers to form a sixth contact and seven contact on the other portion of the pair of first high-concentration impurity area and on the other portion of the pair of second high-concentration impurity area; depositing a fourth conductive material on the overall surface of the substrate; and patterning the fourth conductive material to form a fourth conductive line coming into contact with the other first high-concentration impurity area through the sixth contact, the fourth conductive line being formed long above the first electrode to be intersected with the first and second legs, and to form a fifth conductive line coming into contact with the other second high-concentration impurity area through the seventh contact, the fifth conductive line being formed long above the second electrode to be intersected with the first and second legs.

BRIEF DESCRIPTION OF THE ATTACHED DRAWINGS

FIGS. 8A–8H are plan views of the respective layers' patterns of the SRAM cell array of FIGS. 2A and 2B.

DETAILED DESCRIPTION OF THE INVENTION

Figure 1A:
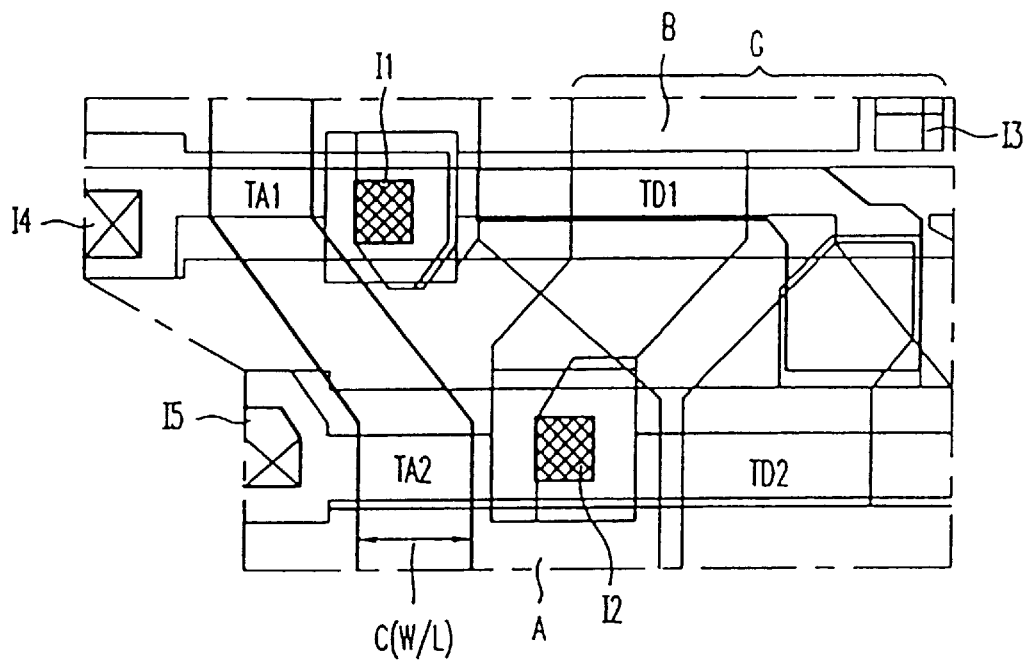
FIG. 1A is a plan view of a conventional SRAM cell.
Figure 1B:
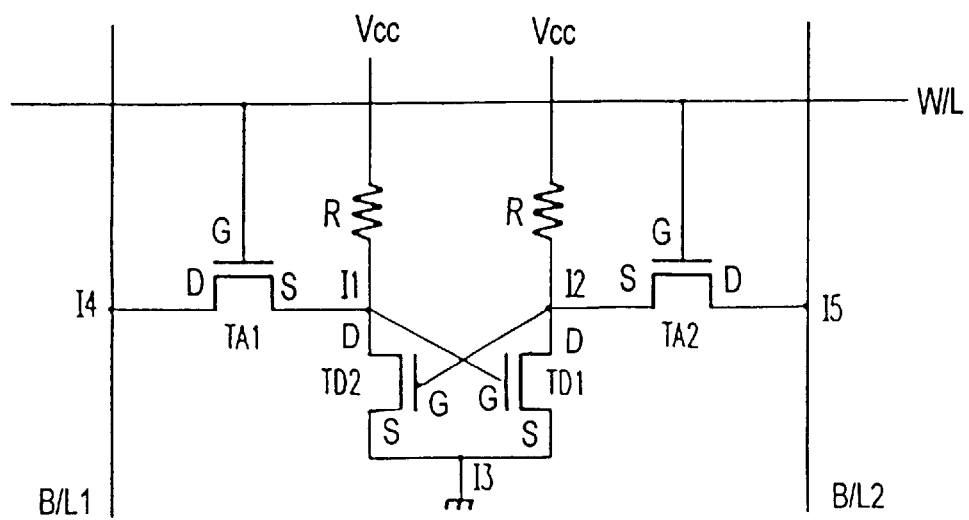
FIG. 1B is an equivalent circuit diagram of the SRAM cell of FIG. 1A.

Hereinafter, a preferred embodiment of the present invention will be described with reference to the attached drawings.

Referring to FIGS. 2A–3D, in an SRAM cell of the present invention, a substrate 30 has a active area 34, which is symmetric centering on a contact C1. A wordline W/L made up of a polysilicon layer is formed to be symmetric centering on the contact C1.

The wordline W/L comprises a body W/L-C spaced apart from the contact C1 by a predetermined distance, and a pair of legs W/L-A and W/L-B elongated in parallel from both edges of body W/L-C centering on the contact C1.

First and second access transistors TA1 and TA2 taking the wordline W/L as the gate are formed symmetric centering on the contact C1. First and second drive transistors TD1 and TD2 are formed symmetric on the substrate between the contact C1 and the first and second access transistors TA1 and TA2 respectively.

Gates GD1 and GD2 of first and second drive transistors TD1 and TD2 are made of a polysilicon layer and formed above the pair of legs W/L-A and W/L-B and above active area 34 placed therebetween.

A pair of bitlines B/L1 and B/L2 are made of metal and formed long to be intersected with the respective legs W/L-A and W/L-B of wordline W/L above gates GD1 and GD2 of first and second drive transistors TD1 and TD2. Of the bitlines, bitline B/L1 comes into contact with drain area 34E of first access transistor TA1 through a contact C7. Bitline B/L2 is in contact with the drain area 34A of second access transistor TA2 through a contact C9.

First load resistor R1 of the SRAM cell is intersected with first leg W/L-A of wordline W/L, and comes into contact with source area 34D of first access transistor TA1 (or drain area of first drive transistor TD1) through a contact C3. At the same time, a first conductive line L1 which is formed same layer of the first load resistor R1 is elongated from the contact C3 on second leg W/L-B, and comes into contact with the gate GD2 of second drive transistor TD2 through a contact C13.

Second load resistor R2 is intersected with first leg W/L-B of wordline W/L, and comes into contact with source area 34B of second access transistor TA2 (or drain area of second drive transistor TD2) through a contact C5. At the same time, the second conductive line L2 which is formed same layer of the first load resistor R2 is elongated from the contact C5 on first leg W/L-A, and comes into contact with gate GD1 of first drive transistor TD1 through a contact C11.

First and second load resistors R1 and R2 are made up of a resistor layer which is usually used as polysilicon. Of the patterned resistor layer, the portion between the contact C3 and contact C13 is doped with an impurity so as to serve as said conductive line L1 for connecting them, and the portion between the contact C5 and contact C11 is doped with an impurity so as to serve as said conductive line L2 for connecting them and VCC line portion is doped with an impurity so as to serve as a conductive line for being used as VCC line.

In the contact C1, a substrate contact portion C10 of polysilicon layer is formed. The source 34C of first and second drive transistors TD1 and TD2 is coupled to the substrate through substrate contact portion C1.

The SRAM cell of the present invention further comprises a first insulating layer 17 formed on the active area 34 under gate portions GA1 and GA2 of first and second access transistors TA1 and TA2 of W/L and under gates GD1 and GD2 of first and second drive transistors TD1 and TD2, a second insulating layer 27 for insulating wordline W/L from gates GD1 and GD2 of first and second drive transistors TD1 and TD2, a third insulating layer 37 for insulating worldline W/L from first and second resistors R1 and R2, a fourth insulating layer 47 formed on third insulating layer 37 including first and second resistors R1 and R2, and a planarization layer 57 formed on fourth insulating layer 47.

A method of fabricating the SRAM cell of the present invention will be described with reference to FIGS. 4A–8H.

Referring to FIGS. 4A, 5A, 6A and 7A, an insulating layer 32 and epitaxial layer 33 are sequentially formed on silicon substrate 31 to thereby form a substrate 30 of first silicon-insulator-second silicon structure. Here, for silicon substrate 31, a substrate where a high-concentration impurity is doped is used.

Subsequently, substrate 30 is divided into a field and active areas 35 and 34 (referring to FIG. 8A). A device isolating field oxide layer 36 is formed on field area 35 of substrate 30 through a general field oxidation process.

Referring to FIGS. 4B, 5B, 6B and 7B, a thin-film oxide layer is formed over the substrate as the first insulating layer. The oxide layer 17 of the active, epitaxial layer 33, insulating layer 32 and s portion of silicon substrate 31 are etched to form the contact C1 by exposing the silicon substrate 31. The oxide layer serves as the gate insulating layer.

Figure 6A:
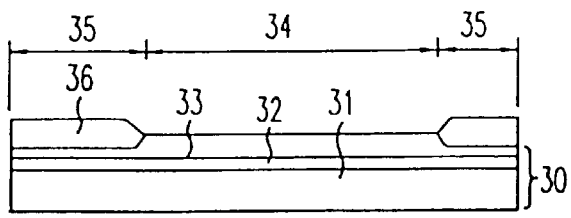
FIGS. 6A–6I show the sequence of manufacturing the SRAM cell cut along line C-C' of FIG. 2A.
Figure 6B:
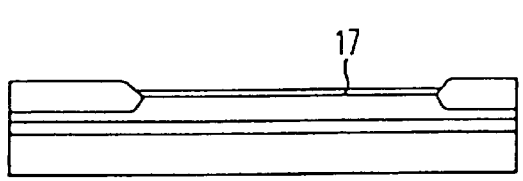
Figure 6C:
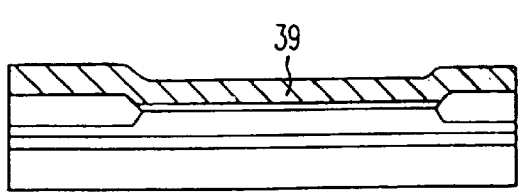
Figure 6D:
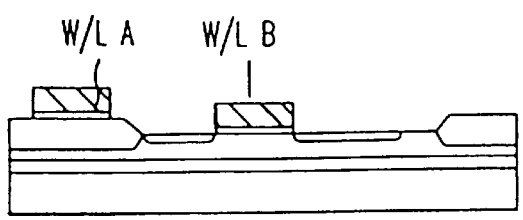
Figure 7D:
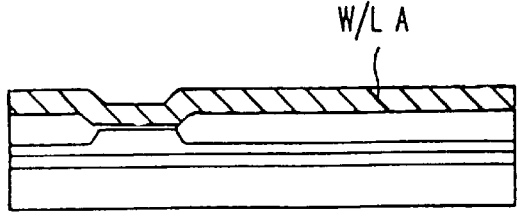
Figure 6E:
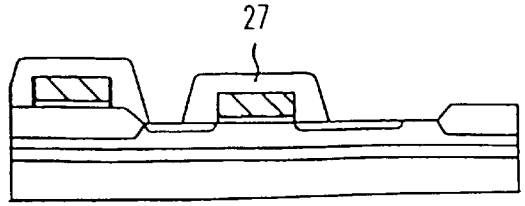
Figure 7E:
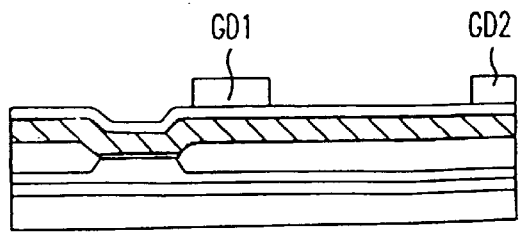
Figure 6F:
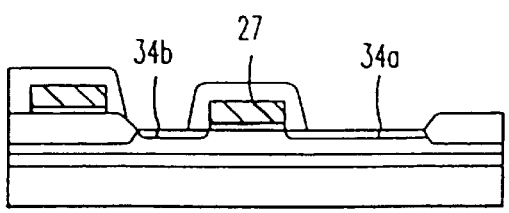
Figure 7F:
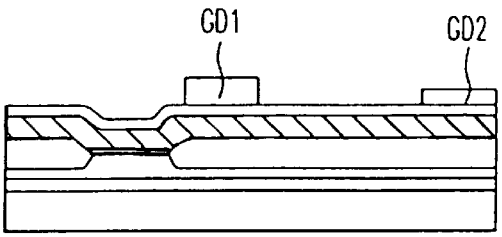
Figure 6G:
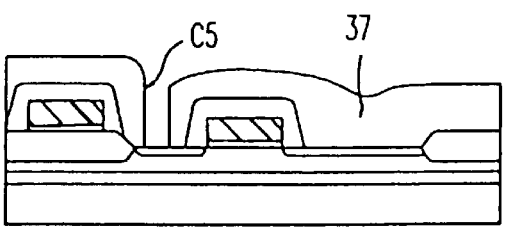
Figure 7G:
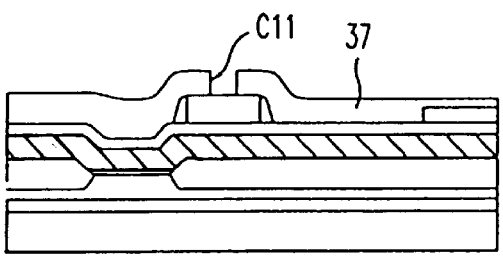
Figure 6H:
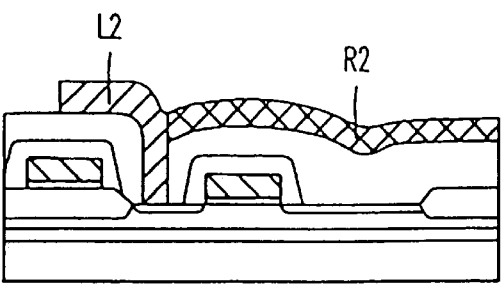
Figure 7H:
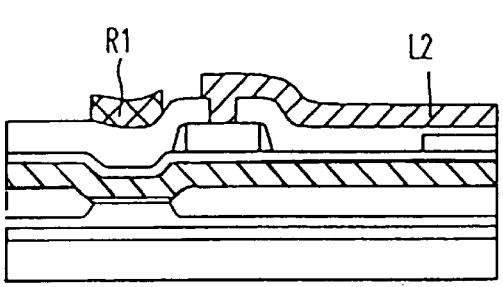
Figure 6I:
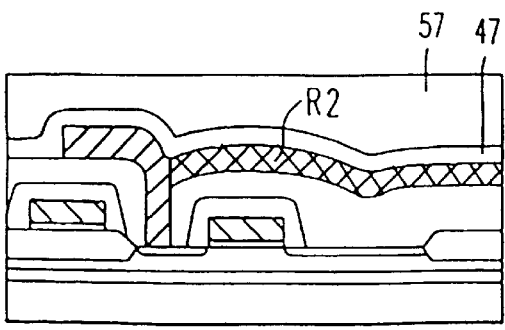
Figure 7I:
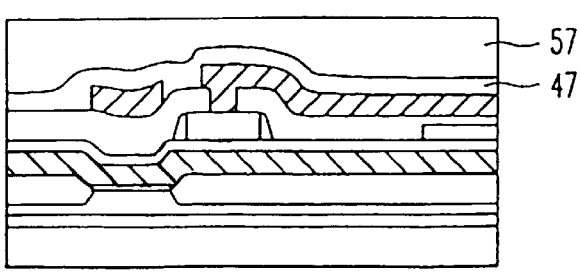

As shown in FIGS. 4C, 5C, 6C and 7C, first polysilicon layer 39 is deposited on the overall surface of the substrate including internal surface of the contact C1. Referring to FIGS. 4D, 5D, 6D and 7D, first polysilicon layer 39 is patterned so that a substrate contact portion C10 is formed in the contact C1 and that the wordline W/L is formed on the oxide layer 17 (see FIG. 8C). Here, wordline W/L is formed to elongate a pair of legs W/L-A and W/L-B in parallel, centering on the contact C1. Of the wordline W/L, each portion GA1 and GA2 above active area 34 respectively act as the gate of first and second access transistors TA1 and TA2, as shown in FIGS. 6D and 7D.

Here, in case that a general monocrystal silicon substrate not the SOI substrate is used, the substrate contact portion C10 may not be formed. Instead, an impurity is implanted into the substrate to form a substrate contact portion.

Referring to FIGS. 4E, 5E, 6E and 7E, a second insulating layer 27 of CVD oxide layer is formed to embrace all the exposed surface of wordline W/L. The second polysilicon layer is deposited on the overall surface of the substrate and patterned to be left above legs W/L-A and W/L-B of the wordline W/L and the active area 34 therebetween. By doing so, gates GD1 and GD2 of drive transistors TD1 and TD2 are formed spaced apart from the substrate contact portion C10 (see FIG. 8D).

Referring to FIGS. 4F, 5F, 6F and 7F, using, as masks, gates GD1 and GD2 of drive transistors TD1 and TD2 and the wordline W/L, a high-concentration n+ type impurity is implanted into the active area 34 to thereby form impurity-areas 34A, 34B, 34C, 34D and 34E. In other words, source areas 34E and 34A and drain areas 34D and 34B of access transistors TA1 and TA2 and source area 34C and drain areas 34D and 34B of drive transistors TD1 and TD2 are formed, respectively.

Figure 2A:
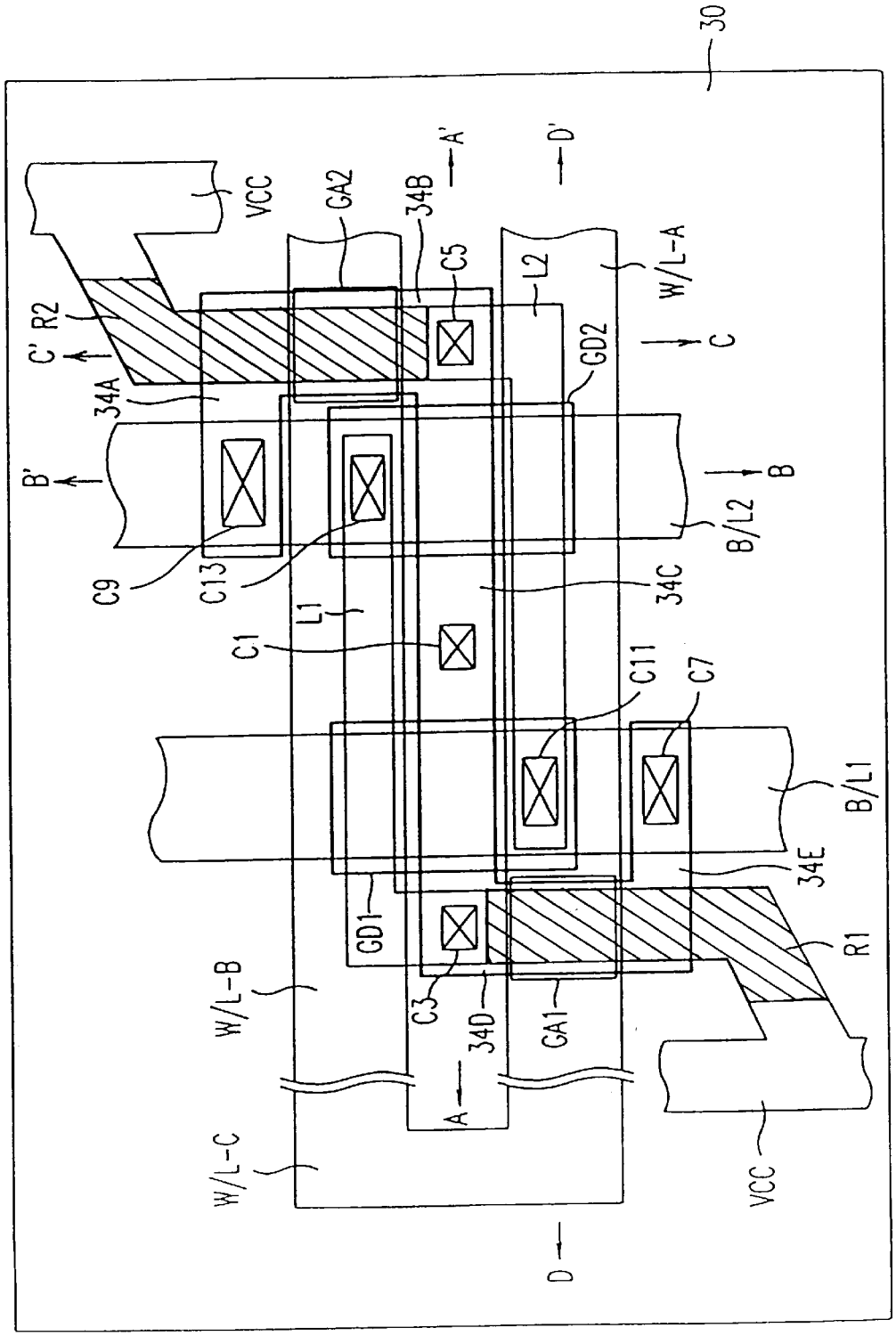
FIG. 2A is a plan view of one embodiment of the SRAM cell of the present invention.
Figure 2B:
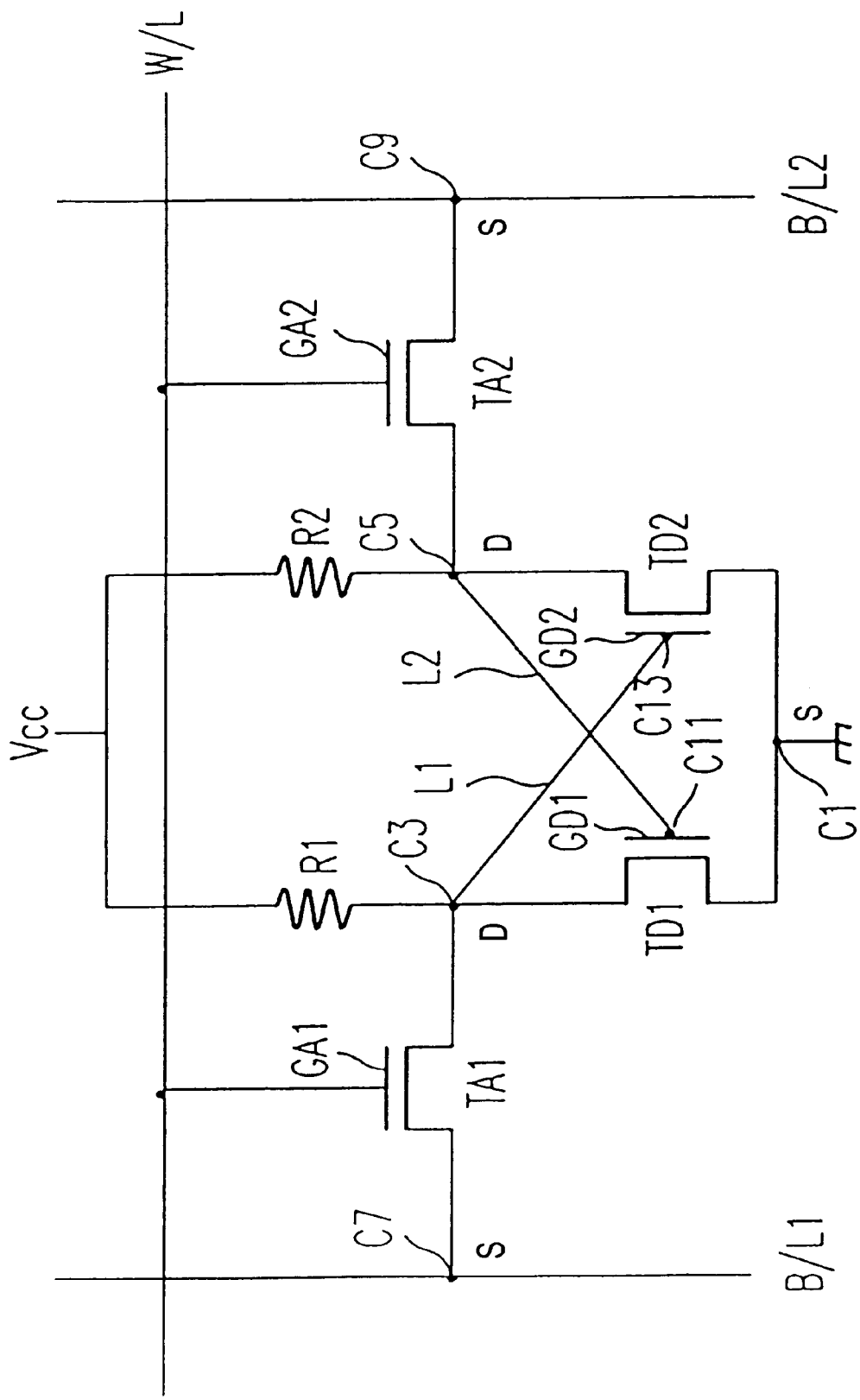
FIG. 2B is an equivalent circuit diagram of the SRAM cell of FIG. 2A.
Figure 3A:
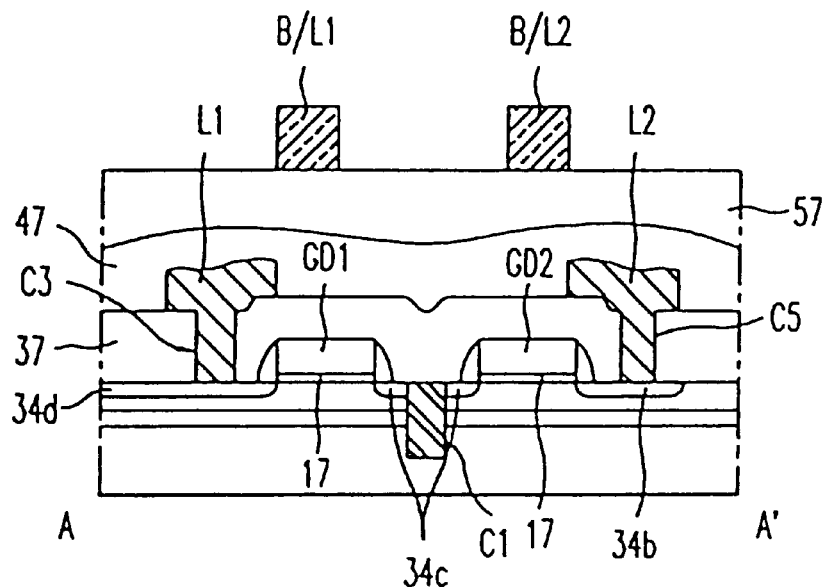
FIGS. 3A–3D are cross-sectional views of the SRAM cell cut along lines A-A', B-B', C-C' and D-D' of FIG. 2A.
Figure 3B:
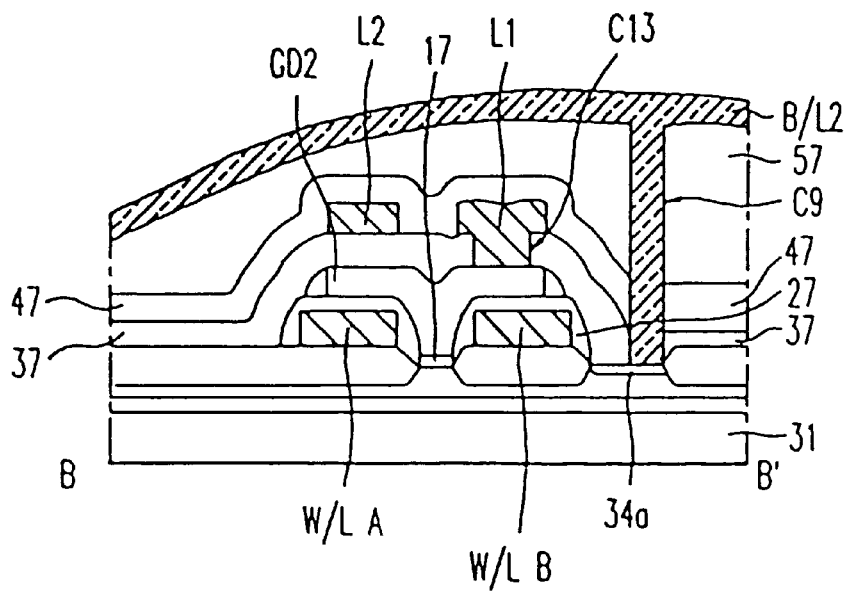
Figure 3C:
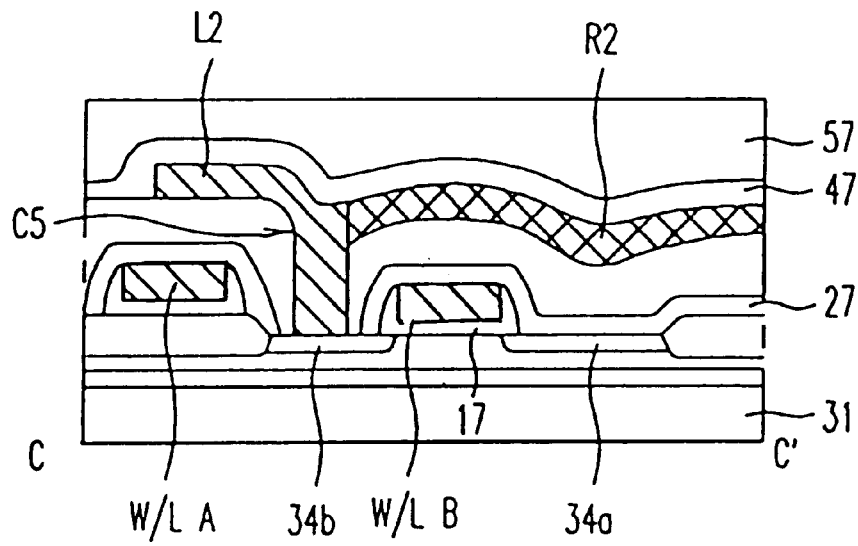
Figure 3D:
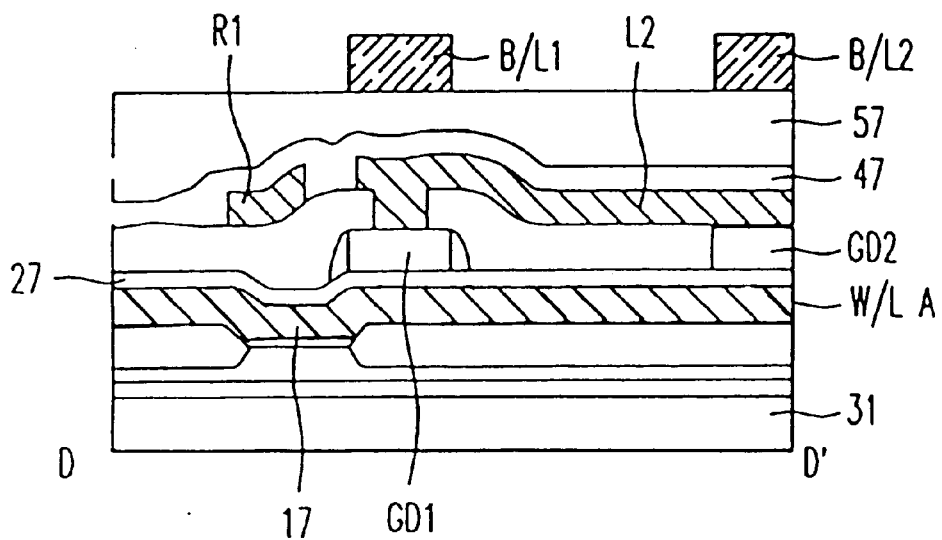
Figure 4A:
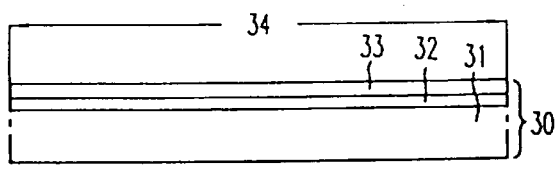
FIGS. 4A–4I show the sequence of manufacturing the SRAM cell cut along line A-A' of FIG. 2A.
Figure 5A:
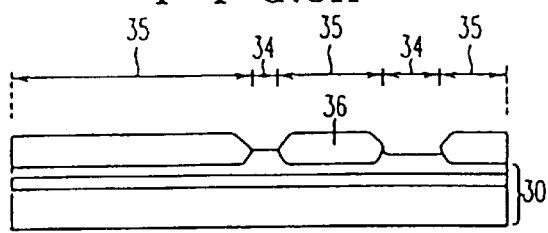
FIGS. 5A–5I show the sequence of manufacturing the SRAM cell cut along line B-B' of FIG. 2A.
Figure 4B:
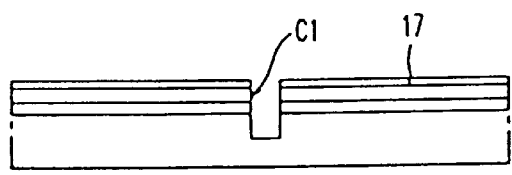
Figure 5B:
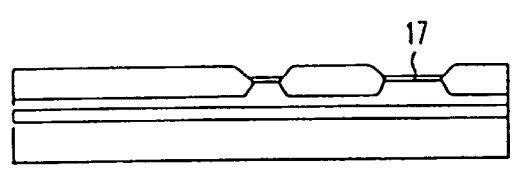
Figure 4C:
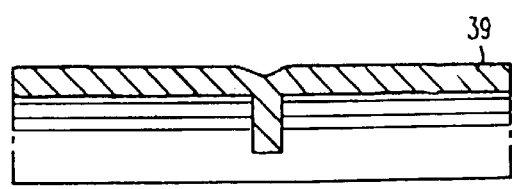
Figure 5C:
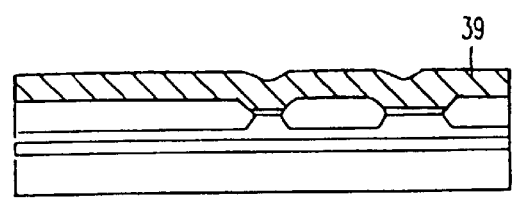
Figure 4D:
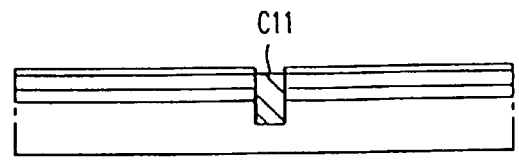
Figure 5D:
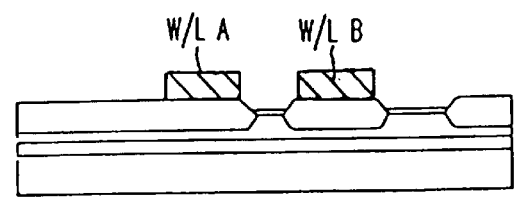
Figure 4E:
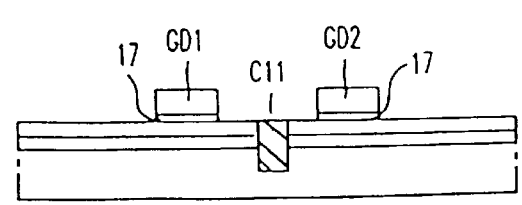
Figure 5E:
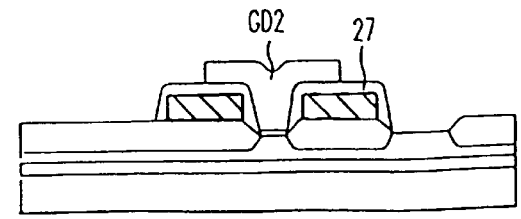
Figure 4F:
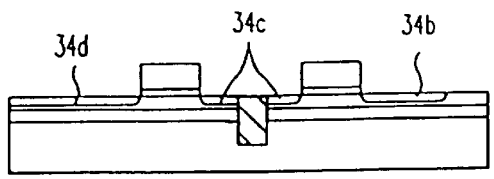
Figure 5F:
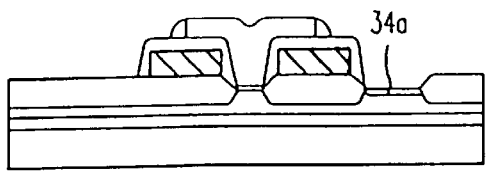
Figure 4G:
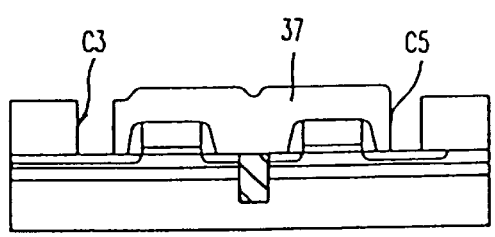
Figure 5G:
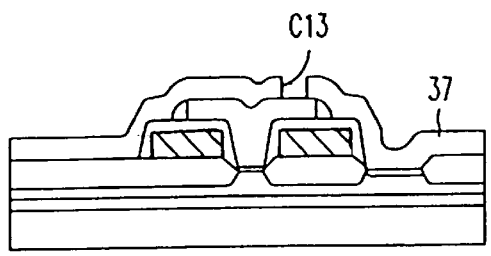
Figure 4H:
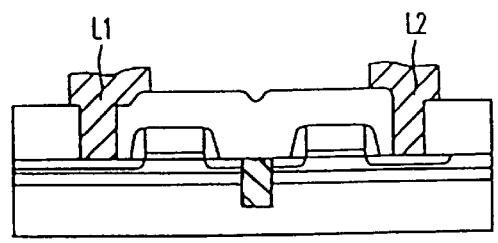
Figure 5H:
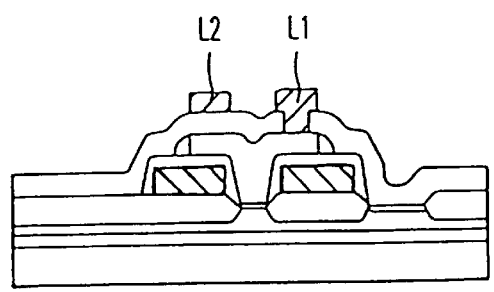
Figure 4I:
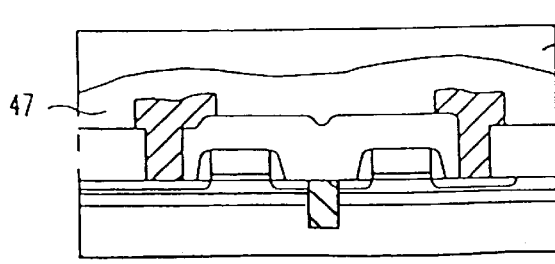
Figure 5I:
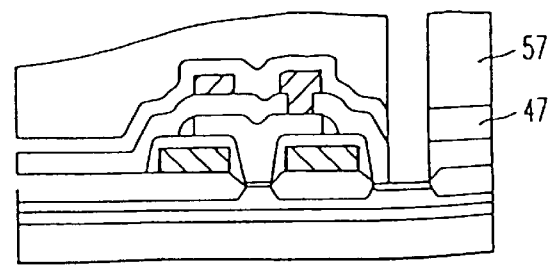
Figure 7A:
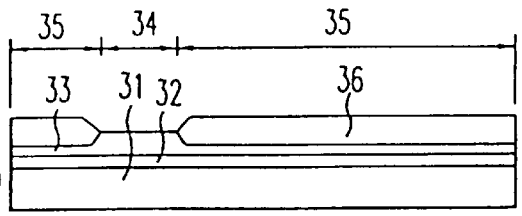
FIGS. 7A–7I show the sequence of manufacturing the SRAM cell cut along line D-D' of FIG. 2A.
Figure 7B:
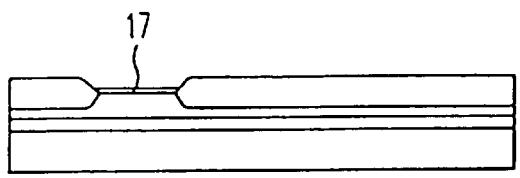
Figure 7C:
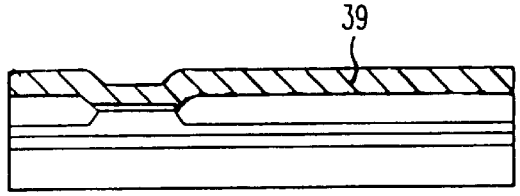

Here, as shown in FIGS. 2A and 2B, drain area 34B of second drive transistor TD2 and drain area 34B of second access transistor TA2 are commonly formed. Drain area 34D of first drive transistor TD1 and drain area 34D of first access transistor TA1 are commonly formed. As shown in FIG. 4F, the contact portion C10 is formed in a center portion of area 34C of drive transistors TD1 and TD2 so that they are in contact with the substrate through the substrate contact portion C10. They are grounded.

Referring to FIGS. 4G, 5G, 6G and 7G, gates GD1 and GD2 of drive transistors TD1 and TD2 are formed, and sidewall spacer 46 is formed on both sides of gates GD1 and GD2. A CVD oxide layer is formed as third insulating layer 37 on the overall surface of the substrate and selectively etched to form a contact C3 and contact C13 for connecting L1, and a contact C5 and contact C11 for connecting L2 (see FIG. 8E). Here, the contact C3 is formed on drain area 34D of first drive transistor TD1 (or source area of first access transistor TA1). The contact C5 is formed on drain area 34B of second drive transistor TD2 (or source area of second access transistor TA2). The contact C11 is formed on gate GD1 of first drive transistor TD1. The contact C13 is formed on gate of second drive transistor TD2.

Figure 8C:
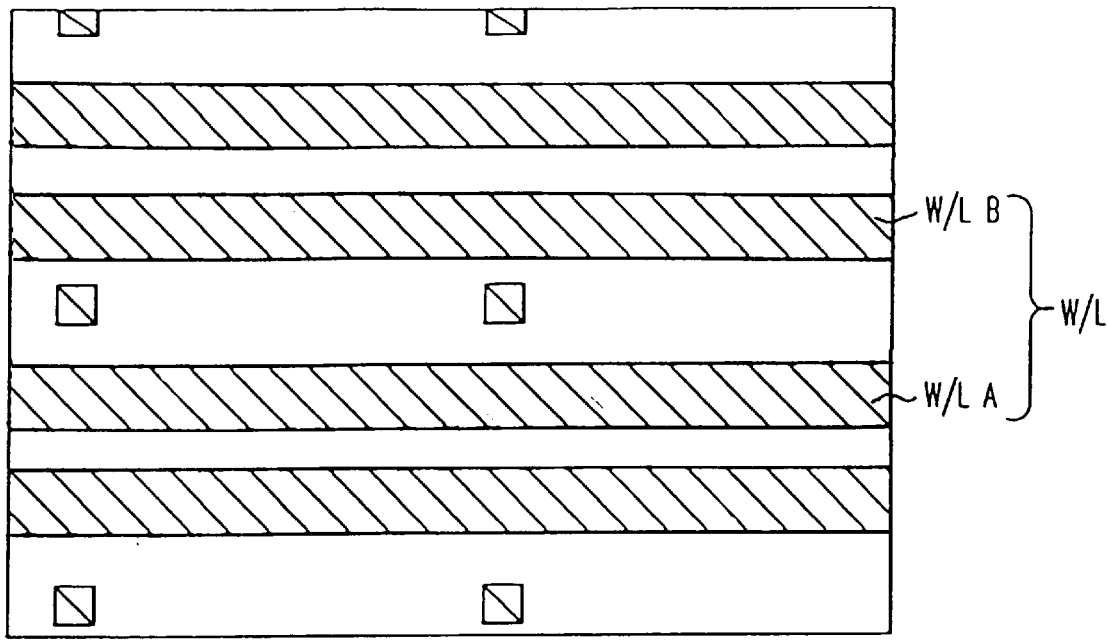
Figure 8D:
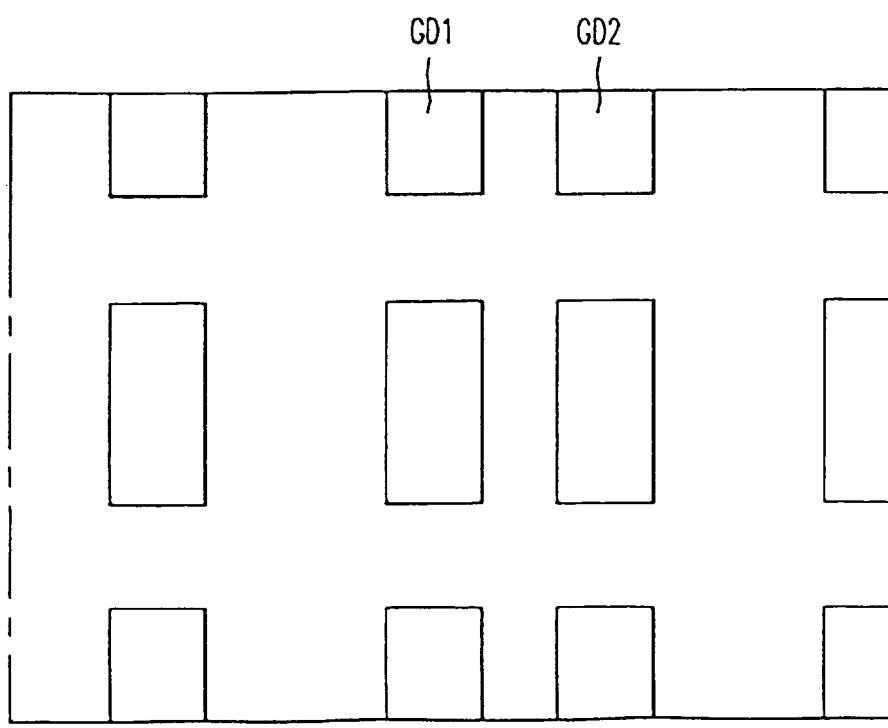
Figure 8E:
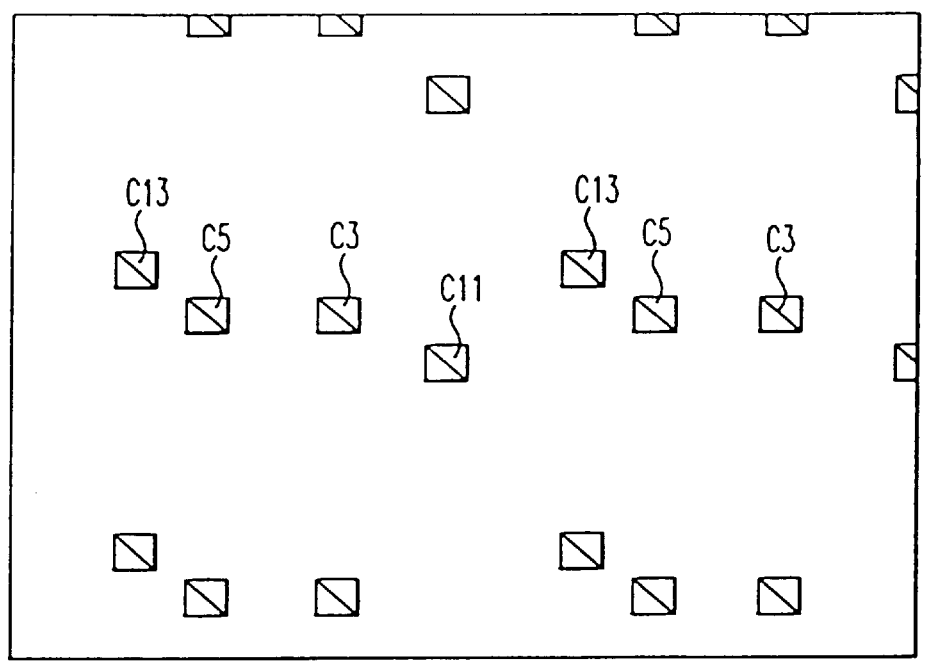
Figure 8F:
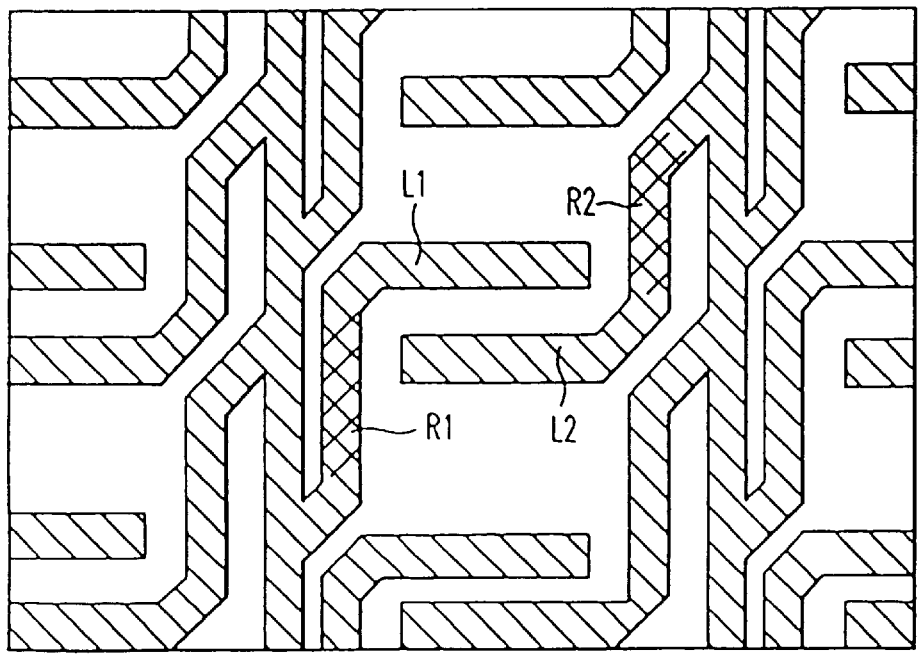
Figure 8G:
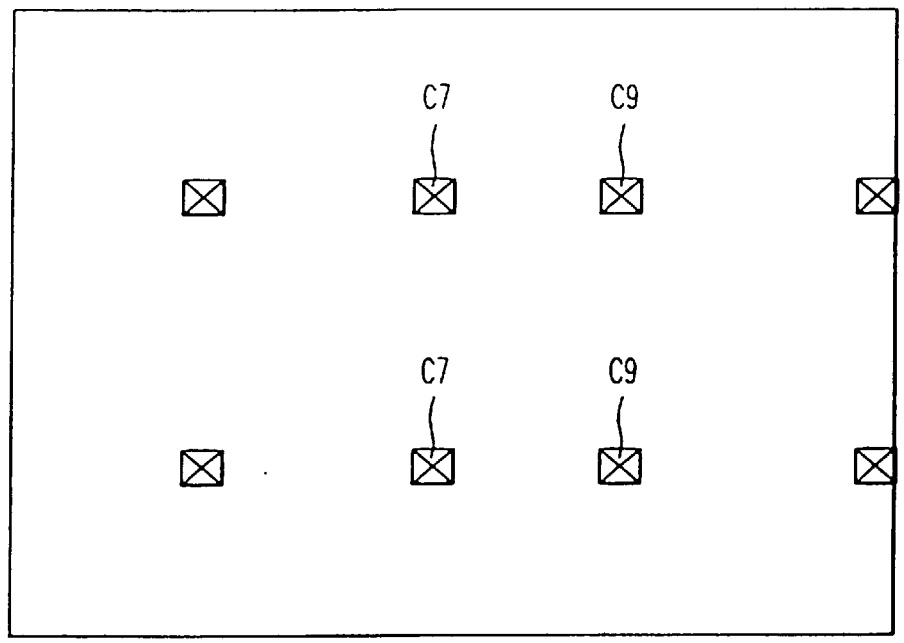
Figure 8H:
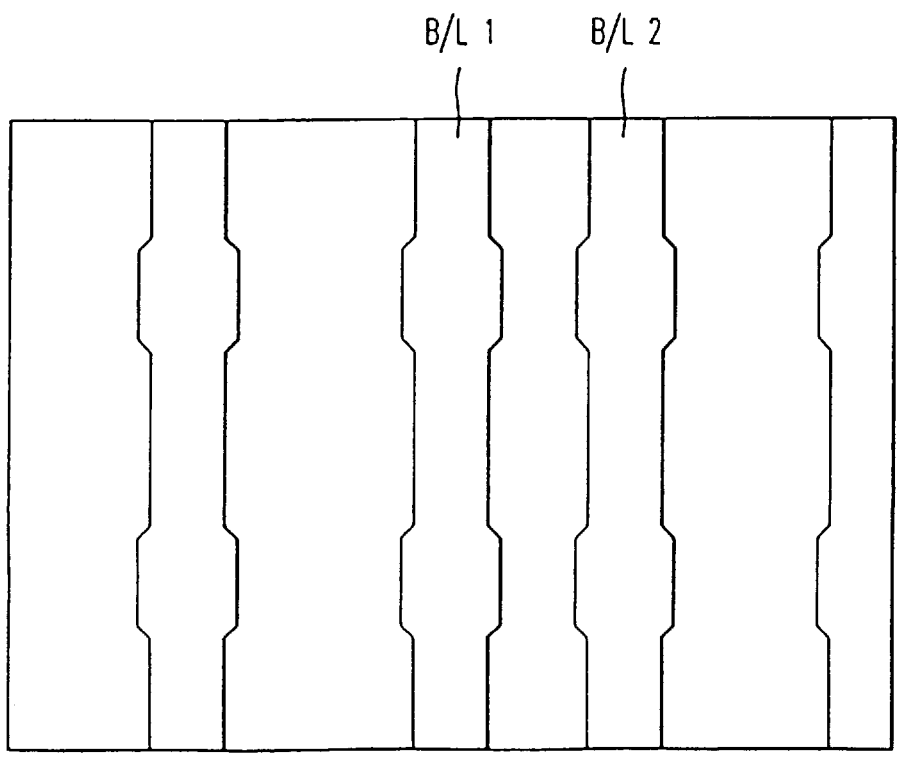
Figure 9:
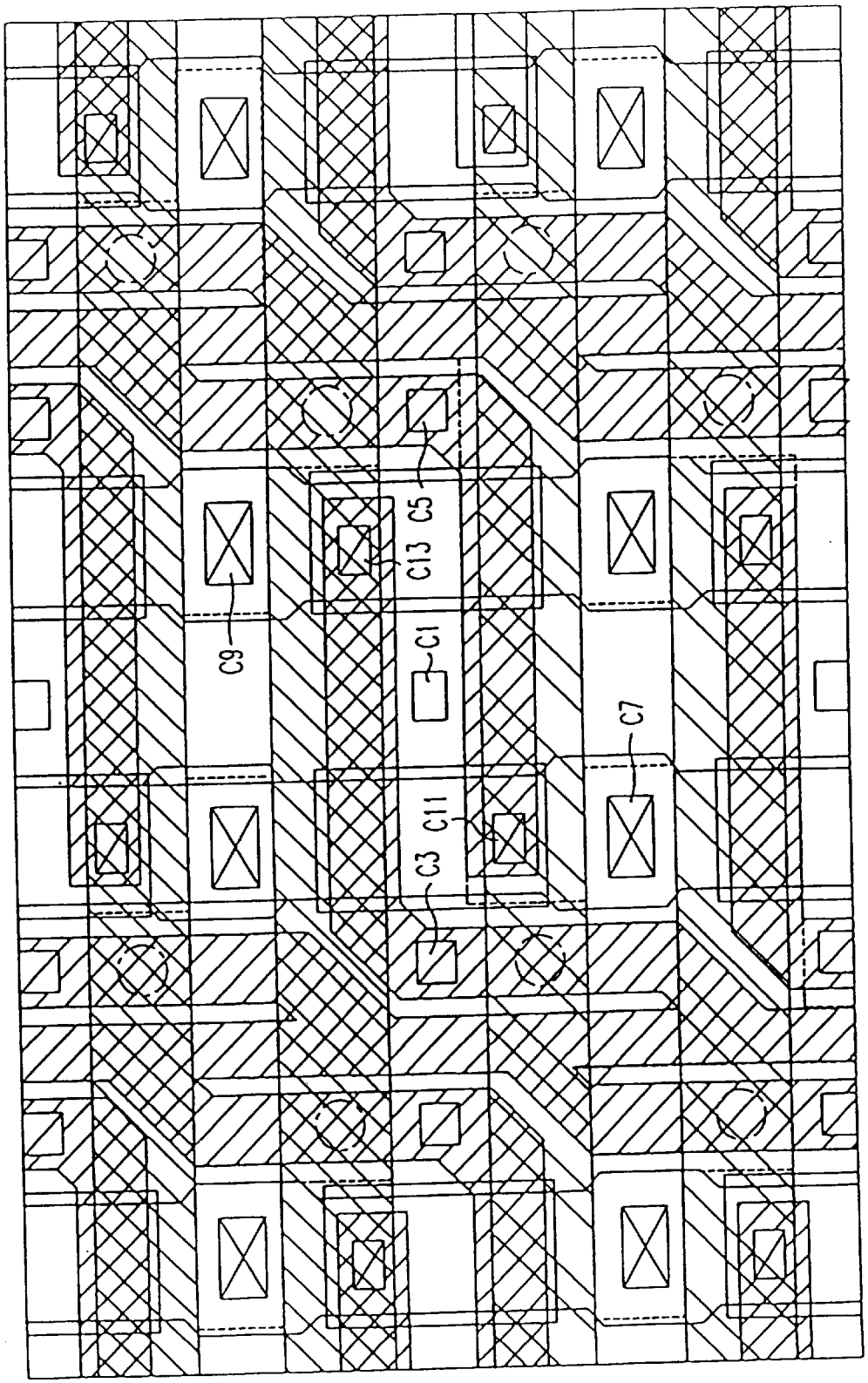
FIG. 9 is a layout of the SRAM cell array of the present invention.

Referring to FIGS. 4H, 5H, 6H and 7H, a third polysilicon layer is deposited on the overall surface of the substrate as resistor layer and patterned to form first and second load resistors R1 and R2, and L1 and L2 (see FIG. 8F). First load resistor R1 is located between L1 and VCC line. Second load resistor R2 is located between L2 and VCC line.

A high-concentration impurity is implanted into the L1, L2 and VCC portion of patterned resistor layer. By doing so, there are formed a low-resistance first wire line L1 for connecting source area 34D of first access transistor TA1 and gate GD2 of second drive transistor TD2, and a low-resistance second wire line L2, for connecting source area 34B of second access transistor TA2 and gate GD1 of first drive transistor TD1, and VCC line.

Referring to FIGS. 4I, 5I, 6I and 7I, an oxide layer 47 is formed on the overall surface of the substrate as the fourth insulating layer. A planarization layer 57 is formed thereon. Planarization layer 57, fourth insulating layer 47, and third insulating layer 37 are selectively etched to form a contact C7 and a contact C9 on source areas 34E and 34A of first and second access transistors TA1 and TA2.

Conductive layer is formed on the overall surface of the substrate including the contact C7 and C9, fabricating the embodiment of the SRAM cell of the present invention.

As described above, the SRAM cell of the present invention is so small as to be advantageous in high integration, and reduces resistance by being grounded through the highly doped substrate, stabilizing the cell more. In addition, the load resistor is easily controlled to sharply reduce resistance.

Furthermore, according to the present invention, the cell is symmetric to contribute to cell stabilization, and step coverage is improved to increase yield. This invention can be employed to all the devices using ground because it is grounded through the substrate besides the SRAM cell.

What is claimed is:

1. A static random access memory (SRAM) cell including two load devices, first and second access transistors, and first and second drive transistors, comprising:

a substrate;

a wordline formed over the substrate, inclusive of two parallel legs having gates of the first and second access transistors, respectively;

gates of the first and second drive transistors formed between the two parallel legs, wherein the gate of the first drive transistor partially overlaps both of the parallel legs and the gate of the second drive transistor partially overlaps both of the parallel legs; and an active area defined in a surface of the substrate under the gates of the first and second access transistors and the gates of the first and second drive transistors.

2. The SRAM cell as claimed in claim 1, wherein the substrate includes:

a first silicon layer;

an insulating layer formed on the first silicon layer; and a second silicon layer formed on the insulating layer.

3. The SRAM cell as claimed in claim 2, wherein the first silicon layer is connected to a common source region of the first and second drive transistors.

4. The SRAM cell as claimed in claim 2, further including:
   a common source region of the first and second drive transistors formed on the second silicon layer;
   a contact hole formed in the second silicon layer in the common source region and in the insulating layer under the common source region; and
   a plug formed in the contact hole to contact both the common source region and the first silicon layer.

5. The SRAM cell as claimed in claim 2, wherein the first silicon layer is formed of heavily doped silicon.

6. The SRAM cell as claimed in claim 1, wherein the gates of the first and second drive transistors are formed in parallel to each other.

7. The SRAM cell as claimed in claim 6, wherein the gates of the first and second drive transistors are disposed on portions of the active area between the gates of the first and second access transistors.

8. The SRAM cell as claimed in claim 1, wherein the active area is symmetric about a point between the gates of the first and second drive transistors.

9. The SRAM cell as claimed in claim 8, wherein the active area includes a plurality of N type, heavily doped diffusion regions in portions of the active area other than portions of the active area which are directly under the gates of the access and drive transistors.

10. The SRAM cell as claimed in claim 9, wherein the plurality of N type, heavily doped diffusion regions includes:
    a common source region between the gates of the first and second drive transistors;
    a first region between the first access and drive transistors;
    a second region between the second access and drive transistors; and
    drain regions under each of the bit lines on the active region not covered by the first and second drive transistors.

11. The SRAM cell as claimed in claim 1, further comprising first and second bit lines connected to drain regions of the first and second access transistors, respectively.

12. The SRAM cell as claimed in claim 11, wherein the first terminals of the first and second load devices are connected to the gates of the second and first drive transistors respectively, and other terminals of the first and second load devices are connected to a supply voltage.

13. A static random access memory (SRAM) cell including two load devices, first and second access transistors, first and second drive transistors, and two bit lines, comprising:
    a substrate;
    a wordline formed over the substrate, including two parallel legs having gates of the first and second access transistors, respectively;
    gates of the first and second drive transistors respectively formed between the two parallel legs, wherein the gate of the first drive transistor partially overlaps both of the parallel legs and the gate of the second drive transistor partially overlaps both of the parallel legs;
    first and second access transistors and first and second drive transistors formed on an active area defined in a surface of the substrate;
    a drain region of the first drive transistor connected to the gate of the second drive transistor; and
    a drain region of the second drive transistor connected to the gate of the first drive transistor.

14. The SRAM cell as claimed in claim 13, wherein the substrate includes:
    a first silicon layer;
    an insulating layer formed on the first silicon layer; and
    a second silicon layer formed on the insulating layer, the second silicon layer having terminals of the first and second access and drive transistors.

15. The SRAM cell as claimed in claim 14, wherein the first silicon layer is connected to a common terminal of the first and second drive transistors.

16. The SRAM cell as claimed in claim 15, further including:
    a contact hole formed in the second silicon layer in the common terminal and in the insulating layer under the common terminal; and
    a plug formed in the contact hole to contact both the common terminal and the first silicon layer.

17. The SRAM cell as claimed in claim 14, wherein the first silicon layer includes a heavily doped silicon layer.

18. The SRAM cell as claimed in claim 13, wherein the gates of the first and second drive transistors are formed in parallel to each other.

19. The SRAM cell as claimed in claim 13, wherein the gates of the first and second drive transistors are disposed on portions of the active area between the gates of the first and second access transistors.

20. The SRAM cell as claimed in claim 13, wherein the active area is symmetric about a point between the gates of the first and second drive transistors.

21. The SRAM cell as claimed in claim 13, wherein the terminals of the transistors include high concentration, N type impurity diffusion regions.

22. The SRAM cell as claimed in claim 13, wherein the terminals of the transistors include:
    a common source region between the gates of the first and second drive transistors;
    a first region between the first access and drive transistors;
    a second region between the second access and drive transistors; and
    drain regions on the opposite sides of the first and second access transistors.

23. The SRAM cell as claimed in claim 22, wherein the drain regions of the first and second access transistors are connected to the two bit lines, respectively.

24. The SRAM cell as claimed in claim 22, wherein the first and second regions are respectively connected to the two load devices.

* * * * *